United States Patent
Chen

(10) Patent No.: US 10,574,248 B2
(45) Date of Patent: Feb. 25, 2020

(54) SUCCESSIVE APPROXIMATION REGISTER ANALOG-TO-DIGITAL CONVERTER AND ASSOCIATED CONTROL METHOD

(71) Applicant: MEDIATEK INC., Hsin-Chu (TW)

(72) Inventor: Hsin-Wei Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/043,180

(22) Filed: Jul. 24, 2018

(65) Prior Publication Data
US 2019/0052282 A1     Feb. 14, 2019

Related U.S. Application Data

(60) Provisional application No. 62/544,934, filed on Aug. 14, 2017.

(51) Int. Cl.
| | |
|---|---|
| *H03M 1/34* | (2006.01) |
| *H03M 1/10* | (2006.01) |
| *H03M 1/20* | (2006.01) |
| *H03M 1/14* | (2006.01) |

(52) U.S. Cl.
CPC ......... *H03M 1/1023* (2013.01); *H03M 1/144* (2013.01); *H03M 1/202* (2013.01)

(58) Field of Classification Search
CPC ............................ H03M 1/1023; H03M 1/144
USPC ......................... 341/163, 155, 144, 172, 120
See application file for complete search history.

(56) References Cited

U.S. PATENT DOCUMENTS

| | | | |
|---|---|---|---|
| 5,646,651 A | 7/1997 | Spannaus | |
| 5,920,275 A | 7/1999 | Hester | |
| 7,205,921 B1* | 4/2007 | Savla | H03M 1/145 |
| | | | 341/155 |
| 7,576,678 B2* | 8/2009 | Chatal | H03M 1/462 |
| | | | 341/155 |

(Continued)

FOREIGN PATENT DOCUMENTS

WO          96/25798 A2     8/1996

OTHER PUBLICATIONS

Chi-Hang Chan et al., A 5.5mW 6b 5GS/s 4x-interleaved 3b/cycle SAR ADC in 65nm CMOS, 2015 IEEE International Solid-State Circuits Conference, Session 26/ Nyquist-Rate Converters/26.5, Feb. 25, 2015, pp. 466-468, XP032748236.

(Continued)

*Primary Examiner* — Peguy Jean Pierre
(74) *Attorney, Agent, or Firm* — Winston Hsu

(57) ABSTRACT

A SAR ADC includes a first capacitor array, a first comparator, a second capacitor array, a second comparator, an arbiter and a control circuit. The first capacitor array is arranged for receiving an input signal to generate a first signal. The first comparator is arranged for comparing the first signal with a first reference signal to generate a first comparison result. The second capacitor array is arranged for receiving the input signal to generate a second signal. The second comparator is arranged for comparing the second signal with a second reference signal to generate a second comparison result. The arbiter is arranged for generating an arbitration result according to the first comparison result and the second comparison result. The control circuit is arranged for generating an output signal according to the first comparison result, the second comparison result and the arbitration result.

4 Claims, 12 Drawing Sheets

(56) References Cited

U.S. PATENT DOCUMENTS

| | | | |
|---|---|---|---|
| 7,737,875 B2* | 6/2010 | Waltari | H03M 1/206 |
| | | | 341/158 |
| 9,294,701 B2* | 3/2016 | Sonoda | H04N 5/378 |
| 2010/0214147 A1* | 8/2010 | Koyama | H03K 7/06 |
| | | | 341/158 |
| 2015/0263744 A1* | 9/2015 | Sharma | H03M 1/0678 |
| | | | 341/118 |

OTHER PUBLICATIONS

Yun-Shiang Shu, A 6b 3GS/s 11mW Fully Dynamic Flash ADC in 40nm CMOS with Reduced Numbers of Comparators, 2012 Symposium on VLSI Circuits Digest of Technical Papers, 2012 IEEE, Jun. 2012, pp. 26-27, XP032204378.

Hualing Wu et al., A Novel 10bit 90MS/s 2b/cycle SAR ADC, The 2013 International Conference on Advanced Technologies for Communications (ATC'13), 2013 IEEE, Oct. 2013, pp. 521-524, XP055539188.

Wei, "A 0.024mm2 8b 400MS/s SAR ADC with 2b/Cycle and Resistive DAC in 65nm CMOS", IEEE International Solid-State Circuits Conference, 2011.

Hong, "A 7b 1GS/s 7.2mW Nonbinary 2b/cycle SAR ADC with Register-to-DAC Direct Control", IEEE, 2012.

Cao, "A 32 mW 1.25 Gs/s 6b 2b/Step SAR ADC in 0.13 um CMOS", IEEE Journal of Solid-State Circuits, vol. 44, No. 3, Mar. 2009.

Chan, "A 3.8mW 8b 1GS/s 2b/cycle Interleaving SAR ADC with Compact DAC Structure", Symposium on VLSI Circuits Digest of Technical Papers, 2012.

\* cited by examiner

| Scenario 1 | | | | |
|---|---|---|---|---|
| S | 0 | 1 | 1 | 1 |
| R | 0 | 0 | 1 | 1 |
| Q | 1 | 1 | 1 | 1 |
| Qb | 1 | 0 | 0 | 0 |
| Note | Preset state | set control asserted first | Arbiter ready | final state |
| Scenario 2 | | | | |
| S | 0 | 0 | 1 | 1 |
| R | 0 | 1 | 1 | 1 |
| Q | 1 | 0 | 0 | 0 |
| Qb | 1 | 1 | 1 | 1 |
| Note | Preset state | reset control asserted first | Arbiter ready | final state |

SUCCESSIVE APPROXIMATION REGISTER ANALOG-TO-DIGITAL CONVERTER AND ASSOCIATED CONTROL METHOD

CROSS REFERENCE TO RELATED APPLICATIONS

This application claims the priority of U.S. Provisional Application No. 62/544,934, filed on Aug. 14, 2017, which is included herein by reference in its entirety.

BACKGROUND

In a conventional 2-bit-per-cycle SAR ADC, three capacitor arrays and three comparators are required to determine two bits in every cycle. However, because of the mismatch/offset between the capacitor arrays and the comparators, the calibrations are mandatory to prevent the performance degradation of the SAR ADC. The complexity and difficulty of the calibrations are related to the numbers of the capacitor arrays and the comparators, and the calibrations are easier if less capacitor arrays and the comparators are used. Therefore, how to provide a novel SAR ADC design with less capacitor arrays and the comparators is an important topic.

SUMMARY

It is therefore an objective of the present invention to provide a SAR ADC having only two capacitor arrays and two comparators, to mitigate the mismatch/offset between the capacitor arrays and the comparators and to lower the complexity of calibrations, to solve the above-mentioned problem.

According to one embodiment of the present invention, a SAR ADC comprises a first capacitor array, a first comparator, a second capacitor array, a second comparator, an arbiter and a control circuit. The first capacitor array is arranged for receiving an input signal to generate a first signal. The first comparator is coupled to the first capacitor array, and is arranged for comparing the first signal with a first reference signal to generate a first comparison result. The second capacitor array is arranged for receiving the input signal to generate a second signal. The second comparator is coupled to the second capacitor array, and is arranged for comparing the second signal with a second reference signal to generate a second comparison result. The arbiter is coupled to the first comparator and the second comparator, and is arranged for generating an arbitration result according to the first comparison result and the second comparison result. The control circuit is coupled to the first comparator, the second comparator and the arbiter, and is arranged for generating an output signal according to the first comparison result, the second comparison result and the arbitration result.

According to another embodiment of the present invention, a method for controlling a SAR ADC is provided, wherein the SAR ADC comprises a first capacitor array, a first comparator, a second capacitor array and a second comparator. The first capacitor array is arranged for receiving an input signal to generate a first signal. The first comparator is coupled to the first capacitor array, and is arranged for comparing the first signal with a first reference signal to generate a first comparison result. The second capacitor array is arranged for receiving the input signal to generate a second signal. The second comparator is coupled to the second capacitor array, and is arranged for comparing the second signal with a second reference signal to generate a second comparison result. In addition, the method comprises: generating an arbitration result according to the first comparison result and the second comparison result; and generating an output signal according to the first comparison result, the second comparison result and the arbitration result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
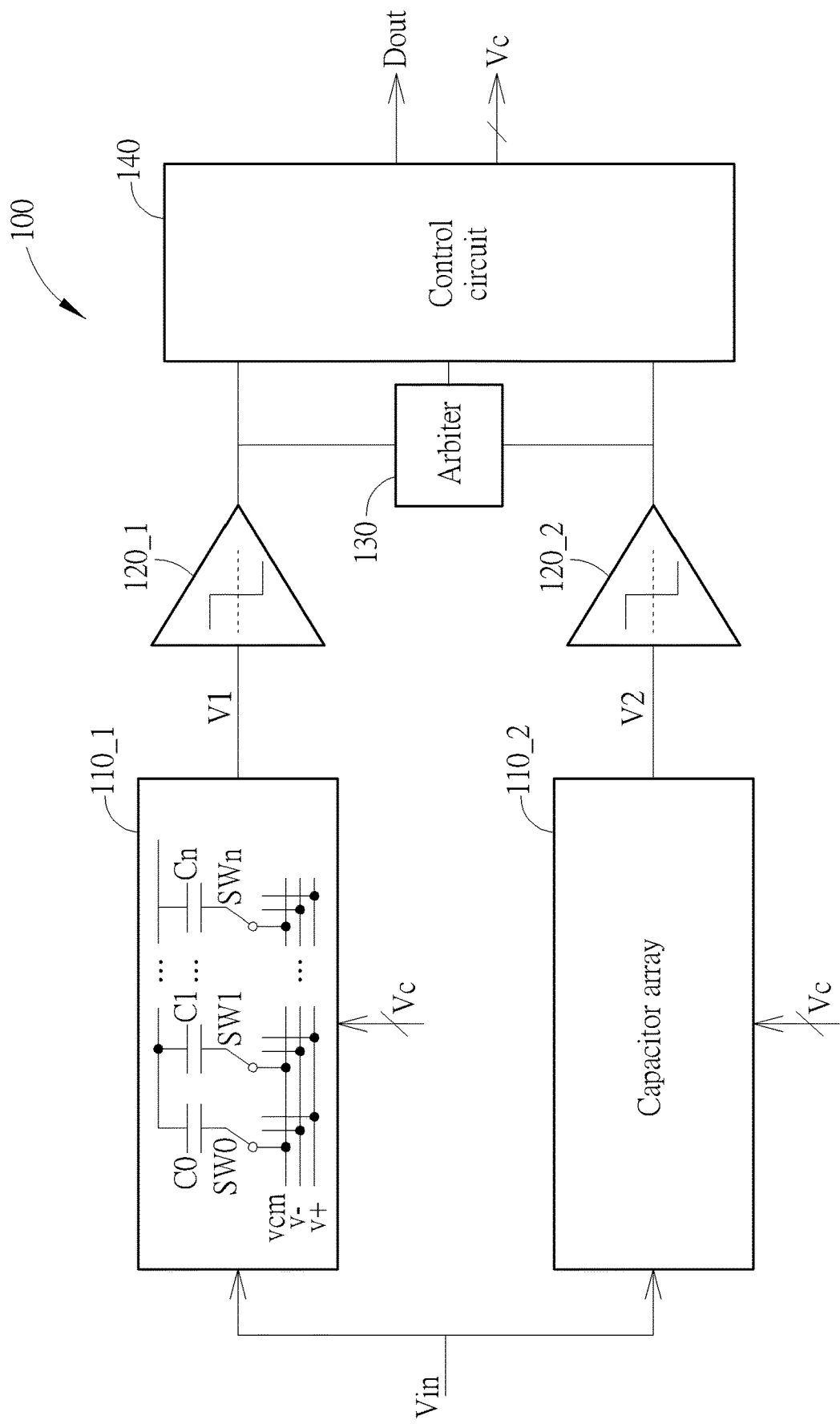
FIG. 1 is a diagram illustrating a SAR ADC according to one embodiment of the present invention.

FIG. 1 is a diagram illustrating a successive approximation register analog-to-digital converter (SAR ADC) 100 according to one embodiment of the present invention. As shown in FIG. 1, the SAR ADC 100 comprises two capacitor arrays 110_1 and 110_2, two comparators 120_1 and 120_2, an arbiter 130 and a control circuit 140. In this embodiment, each of the capacitor arrays 110_1 and 110_2 comprises a plurality of capacitors C0-Cn, wherein one terminal of each of the capacitors C0-Cn of the capacitor arrays 110_1 is coupled to one input terminal of the comparator 120_1, one terminal of each of the capacitors C0-Cn of the capacitor arrays 110_2 is coupled to one input terminal of the comparator 120_2, and the other terminal of each of the capacitors C0-Cn of the capacitor arrays 110_1 and 110_2 is coupled to a common voltage Vcm, a positive voltage V+ or a negative voltage V− via a corresponding switch SW0-SWn, wherein the common voltage Vcm is an average of the positive voltage V+ and the negative voltage V−.

In this embodiment, the SAR ADC 100 is a 2-bit-per-cycle SAR ADC, that is the SAR ADC 100 generates two bits in every cycle, wherein each cycle comprises a comparison step and a switching step, wherein the comparison step means that each of the comparators 120_1 and 120_2 generates one comparison result, and the switching step means that the control circuit 140 controls a portion of the switches SW0-SWn according to the comparison result. For example, if the SAR ADC 100 generates an output signal Dout with 8 bits, the SAR ADC 100 needs four cycles to successfully generates the output signal Dout.

In the operations of the SAR ADC 100, firstly, the switches SWn-Sw0 are controlled by control signals Vc generated by the control circuit 140 to make the capacitors Cn-C0 connect to one of the common voltage Vcm, the positive voltage V+ and the negative voltage V−, and the capacitor array 110_1 samples the input signal Vin to generate a first signal V1 to the comparator 120_1, and the comparator 120_1 compares the first signal V1 with a first reference signal Vref1 to generate a first comparison result, wherein the first reference signal Vref1 may be a fixed voltage in a single-end SAR ADC design or the first reference signal Vref1 may be generated by another capacitor array in a differential design. Meanwhile, the capacitor array 110_2 samples the input signal Vin to generate a second signal V2 to the comparator 120_2, and the comparator 120_2 compares the second signal V2 with a second reference signal Vref2 to generate a second comparison result, wherein the second reference signal Vref2 may be a fixed voltage in a single-end SAR ADC design or the second reference signal Vref2 may be generated by another capacitor array in a differential design. Then, the arbiter 130 receives the first comparison result and the second comparison result and generates an arbitration result according to the first comparison result and the second comparison result, wherein the arbitration result indicates which of the first reference signal Vref1 or the second reference signal Vref2 is more close to the target. Then, the control circuit 140 generates two bits of the output signal Dout by referring to the first comparison result, the second comparison result and the arbitration result. Specifically, the settings of the first reference signal Vref1 and the second reference signal Vref2 can be used to determine which range the sampled signal belongs to, and the arbitration result provides auxiliary information for determining which one of the first reference signal Vref1 and the second reference signal Vref2 is closer to the sampled signal, and the two bits of the output signal Dout can be determined accordingly. For example, if the first comparison result and the second comparison result are inconsistent (e.g. the first comparison result is "0" while the second comparison result is "1"), the arbiter 130 may receive the first comparison result and the second comparison result to generate the arbitration result according to their generation information, wherein the generation information may be generation time of the first/second comparison results.

In one embodiment, the arbiter 130 is a time-based arbiter, and the arbiter 130 receives the first comparison result and the second comparison result to generate the arbitration result by referring to the generation times of the first comparison result and the second comparison result (i.e. the time points that the first comparison result and the second comparison result are successfully outputted). Specifically, because the processing speed of the comparator 110_1/110_2 depends on a residue between the sampled signal and the reference signal (i.e., a difference between the first/second signal V1/V2 and the first/second reference signal), that is when the first signal V1 is closer to the first reference signal Vref1, the comparator 110_1 needs more time to generate the first comparison result. Therefore, when the generation time of the first comparator result is later than the generation time of the second comparison result, it means that the first comparison result is closer to the goal voltage (i.e. the first reference signal Vref1), and the arbiter 130 may generate the arbitration result indicating that the first comparison result is correct or more reliable; on the other hand, when the generation time of the first comparator result is earlier than the generation time of the second comparison result, it means that the second comparison result is closer to the goal voltage (i.e. the second reference signal Vref2), and the arbiter 130 may generate the arbitration result indicating that the second comparison result is correct or more reliable.

Figure 2:
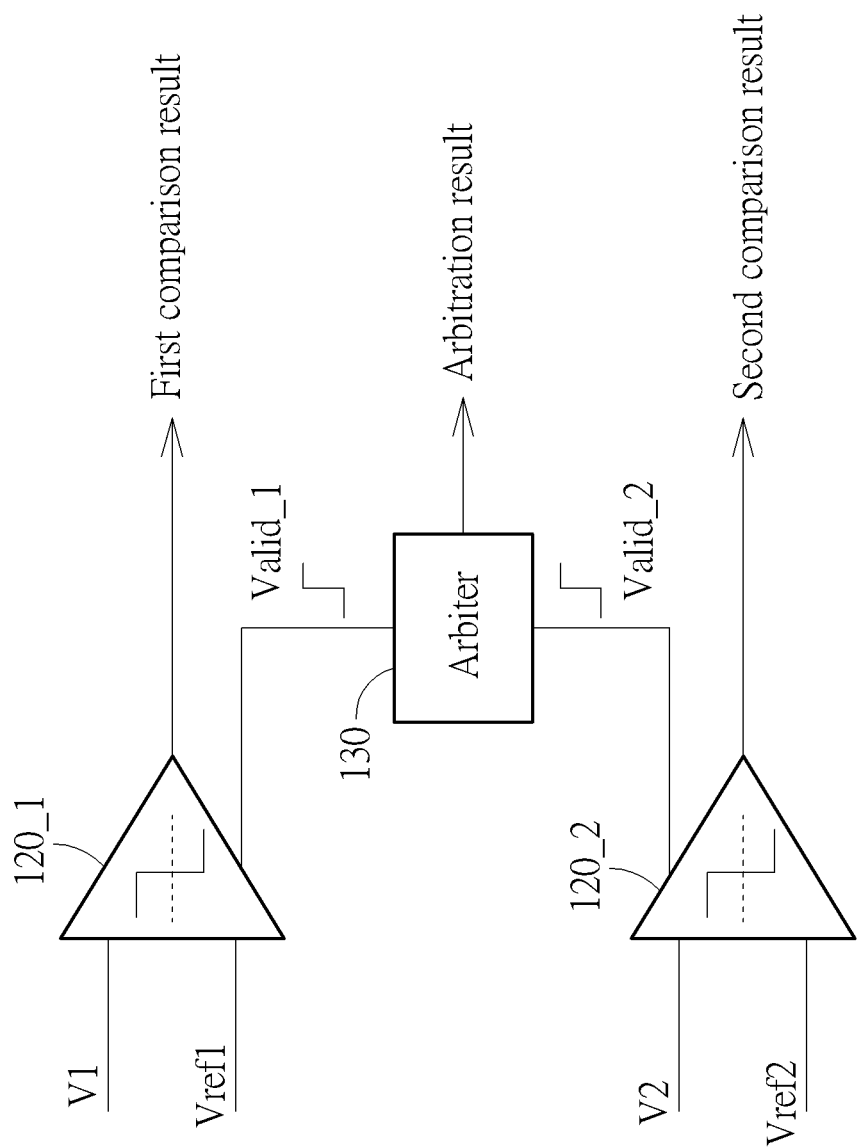
FIG. 2 shows that the arbiter generates the arbitration result by referring to the generation times of the first comparison result and the second comparison result according to one embodiment of the present invention.

FIG. 2 shows that the arbiter 130 generates the arbitration result by referring to the generation times of the first comparison result and the second comparison result according to one embodiment of the present invention. As shown in FIG. 2, in addition to the first comparison result, the comparator 120_1 further generates a first valid signal Valid_1 for indicating the generation time of the first comparison result. In detail, when the comparator 120_1 completes the comparing operation and successfully outputs the first comparison result, the first valid signal Valid_1 changes its voltage level or logical value, such as from a low voltage level (i.e. logical value "0") to a high voltage level (i.e. logical value "1"). Similarly, when the comparator 120_2 completes the comparing operation and successfully outputs the second comparison result, the second valid signal Valid_2 changes its voltage level or logical value, such as from a low voltage level (i.e. logical value "0") to a high voltage level (i.e. logical value "1"). Therefore, the arbiter 130 can refer to transition times of the first valid signal Valid_1 and the second valid signal Valid_2 to determine the generation times of the first comparison result and the second comparison result, then the arbiter 130 generates the arbitration result indicating which one of the first comparison result and second comparison result has a later or earlier generation time.

Figure 3:
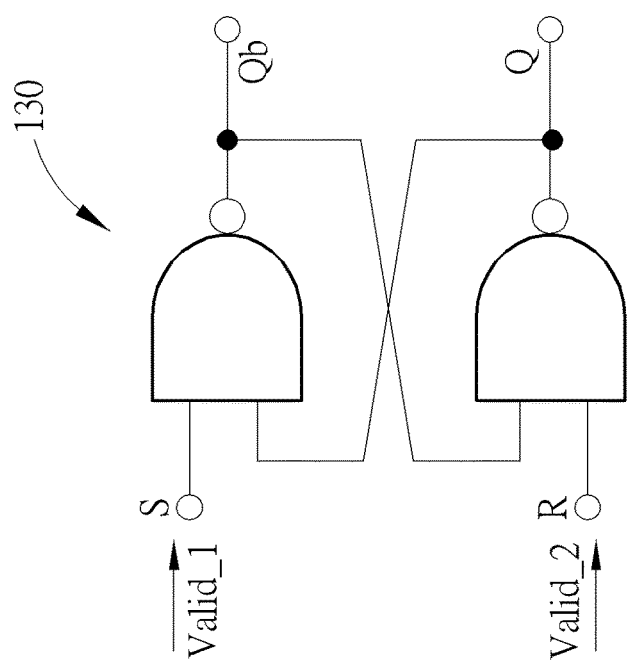
FIG. 3 shows the arbiter according to one embodiment of the present invention.

FIG. 3 shows the arbiter 130 according to one embodiment of the present invention, where the arbiter 130 is implemented by a set-reset latch (SR latch) having two NAND gates for receiving the first valid signal Valid_1 and the second valid signal Valid_2. As shown in FIG. 3, there are two scenarios, where the first scenario indicates that the generation time of the first comparison result is earlier than the generation time of the second comparison result, and the second scenario indicates that the generation time of the first comparison result is later than the generation time of the second comparison result. For the first scenario, in the preset state, the comparators 120_1 and 120_2 does not generate the first comparison result and the second comparison result, respectively, so the first valid signal Valid_1 and the second valid signal Valid_2 (i.e., "S" node and "R" node of the SR latch) correspond to logical value "0". Then, the comparator 120_1 successfully generates the first comparison result, and the first valid signal Valid_1 changes its logical value, and a "Qb" node of the SR latch becomes logical value "0" while a "Q" node of the SR latch stays in the logical value "1". Then, the comparator 120_2 successfully generates the second comparison result, and the second valid signal Valid_2 changes its logical value, and the "Q" node and the "Qb" node of the SR latch remain the same. Therefore, in the final state, the "Q" node and the "Qb" node of the SR latch correspond to the logical values "1" and "0", respectively, and this logical value combination serves as the arbitration result indicating that the generation time of the first comparison result is earlier than the generation time of the second comparison result.

For the second scenario, in the preset state, the comparators 120_1 and 120_2 does not generate the first comparison result and the second comparison result, respectively, so the first valid signal Valid_1 and the second valid signal Valid_2 correspond to logical value "0". Then, the comparator 120_2 successfully generates the second comparison result, and the second valid signal Valid_1 changes its logical value, and the "Q" node of the SR latch becomes logical value "0" while the "Qb" node of the SR latch stays in the logical value "1". Then, the comparator 120_1 successfully generates the first comparison result, and the first valid signal Valid_1 changes its logical value, and the "Q" node and the "Qb" node of the SR latch remain the same. Therefore, in the final state, the "Q" node and the "Qb" node of the SR latch correspond to the logical values "0" and "1", respectively, and this logical value combination serves as the arbitration result indicating that the generation time of the first comparison result is later than the generation time of the second comparison result.

It is noted that the embodiment shown in FIGS. 2 and 3 is for illustrative purposes only, without a limitation of the present invention. As long as the arbiter 130 can generate the arbitration result indicating that which one of the first comparison result and the second comparison result has a later generation time, the arbiter may have different circuit designs.

In the following embodiment, without a limitation of the present invention, the value at the "Q" node of the SR latch serves as the arbitration result. That is, the arbiter 130 generates the arbitration result "1" to the control circuit 140 if the generation time of the first comparison result is earlier than the generation time of the second comparison result; and the arbiter 130 generates the arbitration result "0" (or "−1" with the same meaning in the following embodiment) to the control circuit 140 if the generation time of the first comparison result is later than the generation time of the second comparison result.

Figure 4:
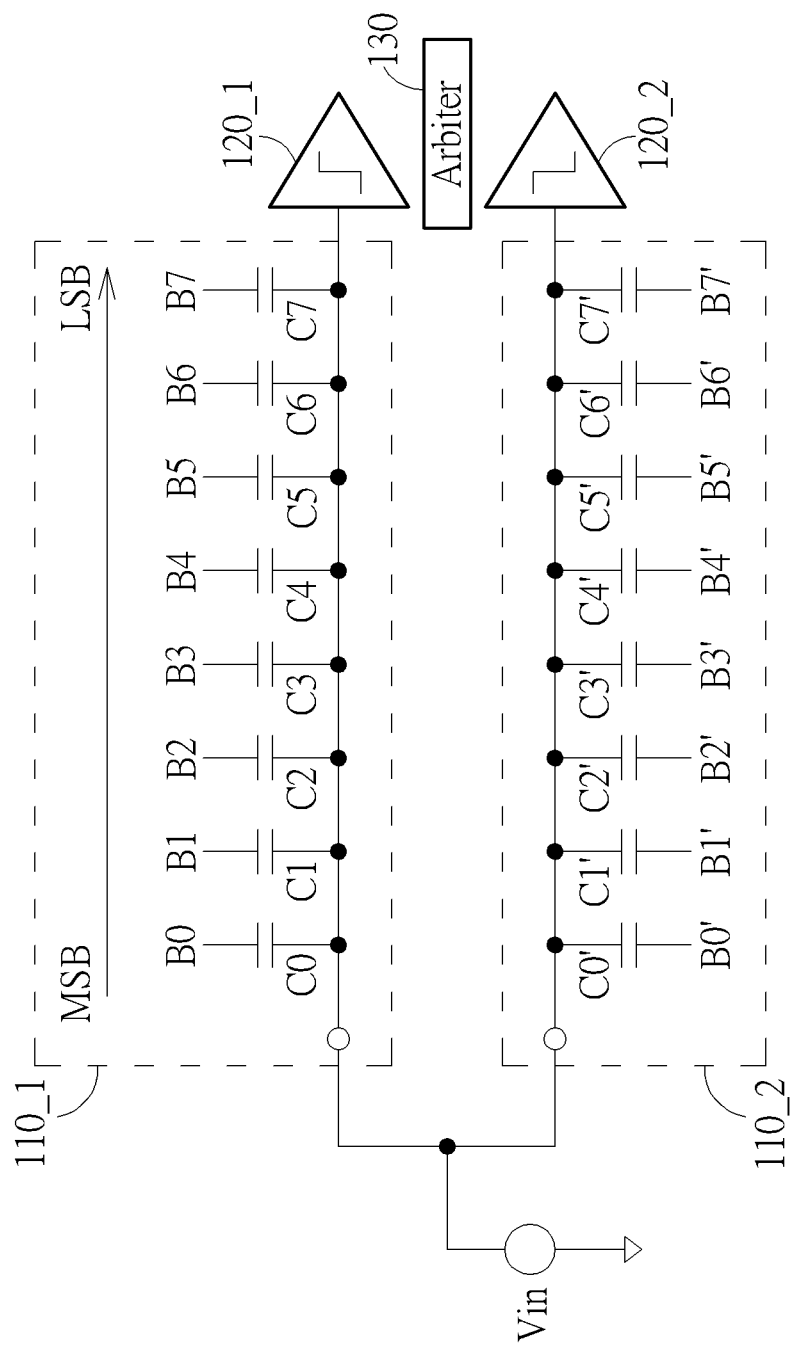
FIGS. 4-12 are diagrams illustrating steps of the SAR ADC for generating an 8-bit output signal according to one embodiment.

FIGS. 4-12 are diagrams illustrating steps of the SAR ADC 100 for generating an 8-bit output signal Dout according to one embodiment. To make the example be simpler, the SAR ADC 100 has a single-end design, that is the first/second reference signal used by the comparator 120_1/120_2 is a fixed voltage. As shown in FIG. 4, the capacitor array 110_1 comprises eight capacitors C0-C7, and the capacitor array 110_2 comprises eight capacitors C0'-07', the output signal Dout comprises bits B0-B7 or B0'-B7', wherein each of the bits B0 and B0' corresponds to a most significant bit (MSB), and each of the bits B7 and B7'corresponds to a least significant bit (LSB). For simplicity, the switches SW0-SWn, the common voltage Vcm, the positive voltage V+ and the negative voltage V− are omitted here, and the bit value is used to represent the connection of the corresponding capacitor. For example, if the bit B0 shows "0", it means that the capacitor C0 is connected to the common voltage Vcm via the switch; if the bit B0 shows "1", it means that the capacitor C0 is connected to the positive voltage V+ via the switch; and if the bit B0 shows "−1", it means that the capacitor C0 is connected to the negative voltage V− via the switch.

In addition, the embodiment shown in FIG. 4 also indicates that the SAR ADC 100 are sampling the input signal Vin, and the bits B0-B7 and B0'-B7' are reset to the common voltage Vcm when the sampling operations are performed.

Figure 5:
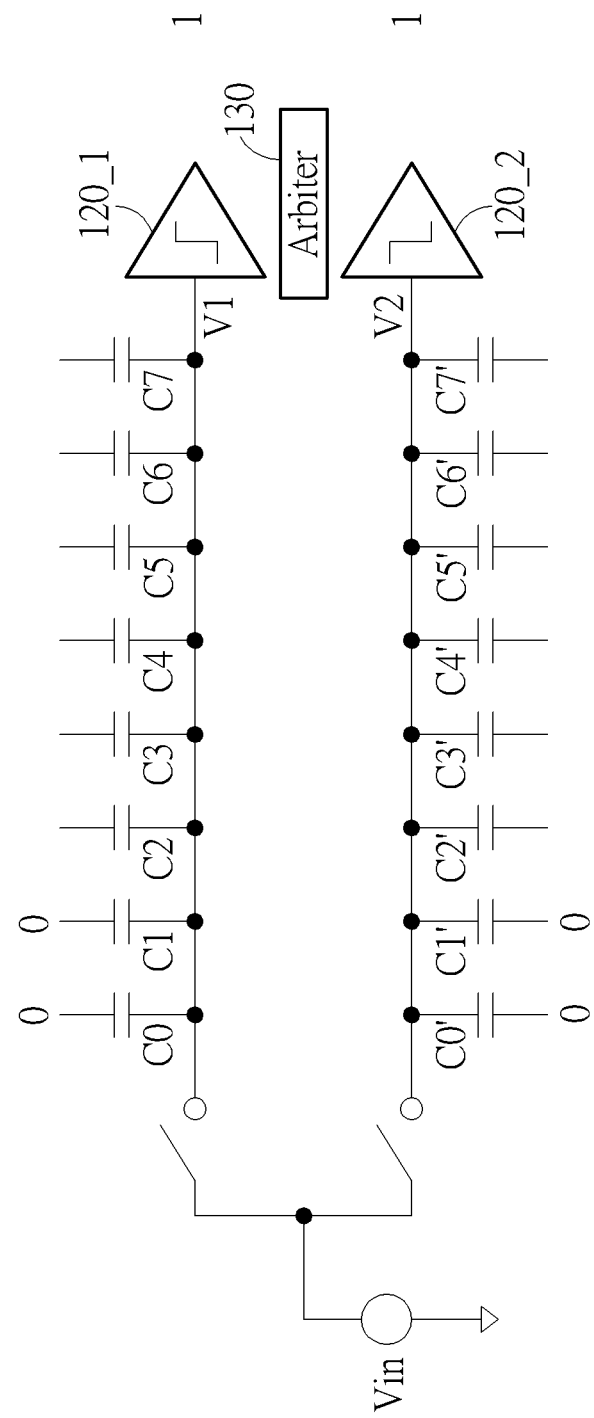

FIG. 5 shows a comparison step of a first cycle according to one embodiment of the present invention. As shown in FIG. 5, the control circuit 140 controls the capacitor array 110_1 and 110_2 to make the capacitors C0, C1, C0' and C1' connect to the common voltage Vcm, and the comparator 120_1 compares the first signal V1 with the first reference signal to generate the first comparison result, and the comparator 120_2 compares the second signal V2 with the second reference signal to generate the second comparison result. In this embodiment, it is assumed that the first signal V1 is greater than the first reference signal, and the second signal V2 is greater than the second reference signal, so both the first comparison result and the second comparison result are equal to "1".

Figure 6:
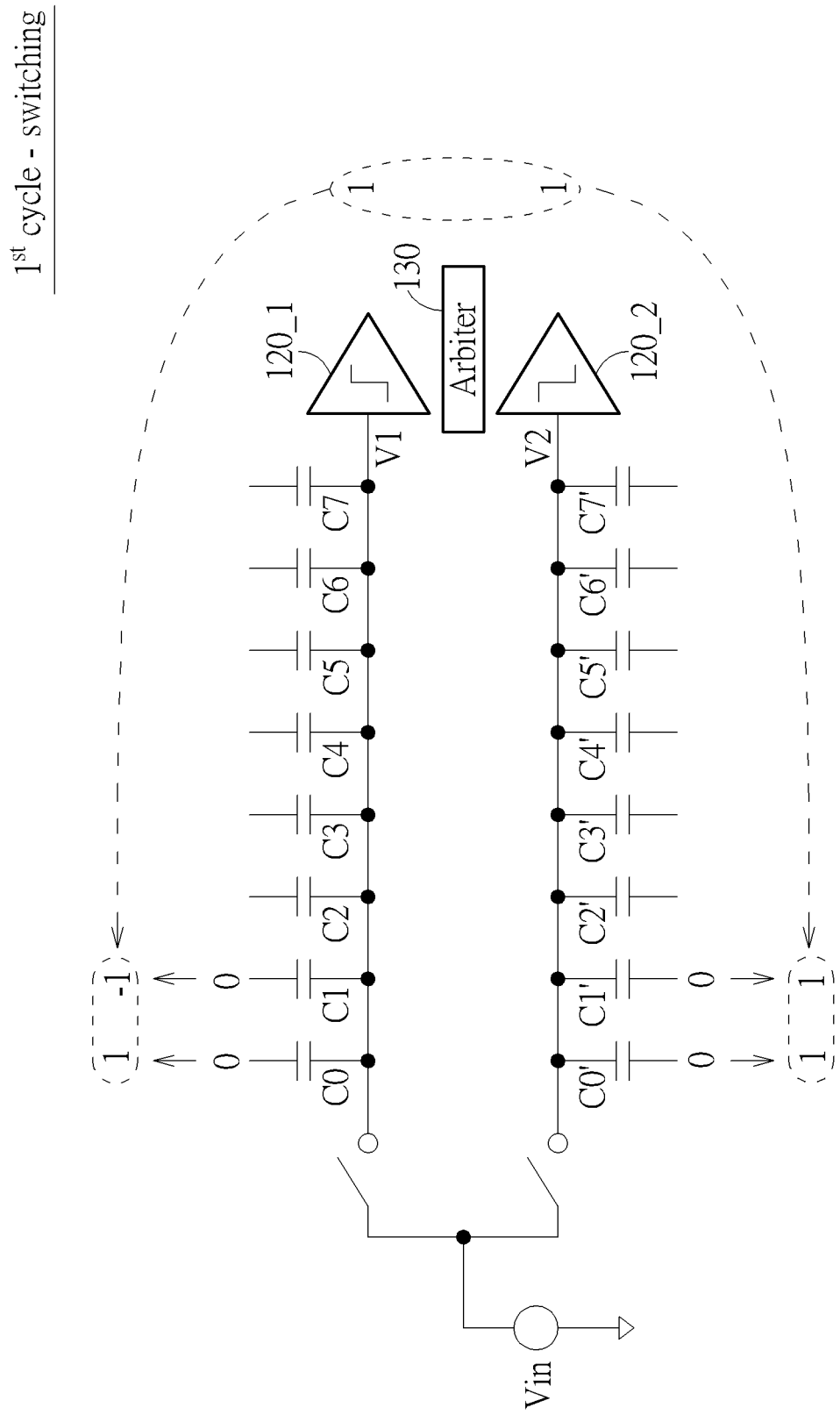

FIG. 6 shows a switching step of the first cycle according to one embodiment of the present invention. As shown in FIG. 6, the control circuit 140 refers to the first comparison result and the second comparison result to switch the connections of the capacitors C0, C1, C0' and C1'. Specifically, because both the first comparison result and the second comparison result are equal to "1", the bits B0 and B0' are changed from "0" to "1", that is the capacitors C0 and C0' are connected to the positive voltage V+. In addition, the bit B1 is determined by a conservative guessing and the bit B1 is an inverse of the bit B0 (i.e. B1="−1"), and the bit B1' is determined by an aggressive guessing and the bit B1' is the same as the bit B0' (i.e. B1'="1").

In addition, because the first comparison result is the same as the second comparison result in the first cycle, the arbitration result may not be considered. In other word, no matter the generation time of the first comparison result is earlier or later than the generation time of the second comparison result, the switching step will be the same.

Figure 7:
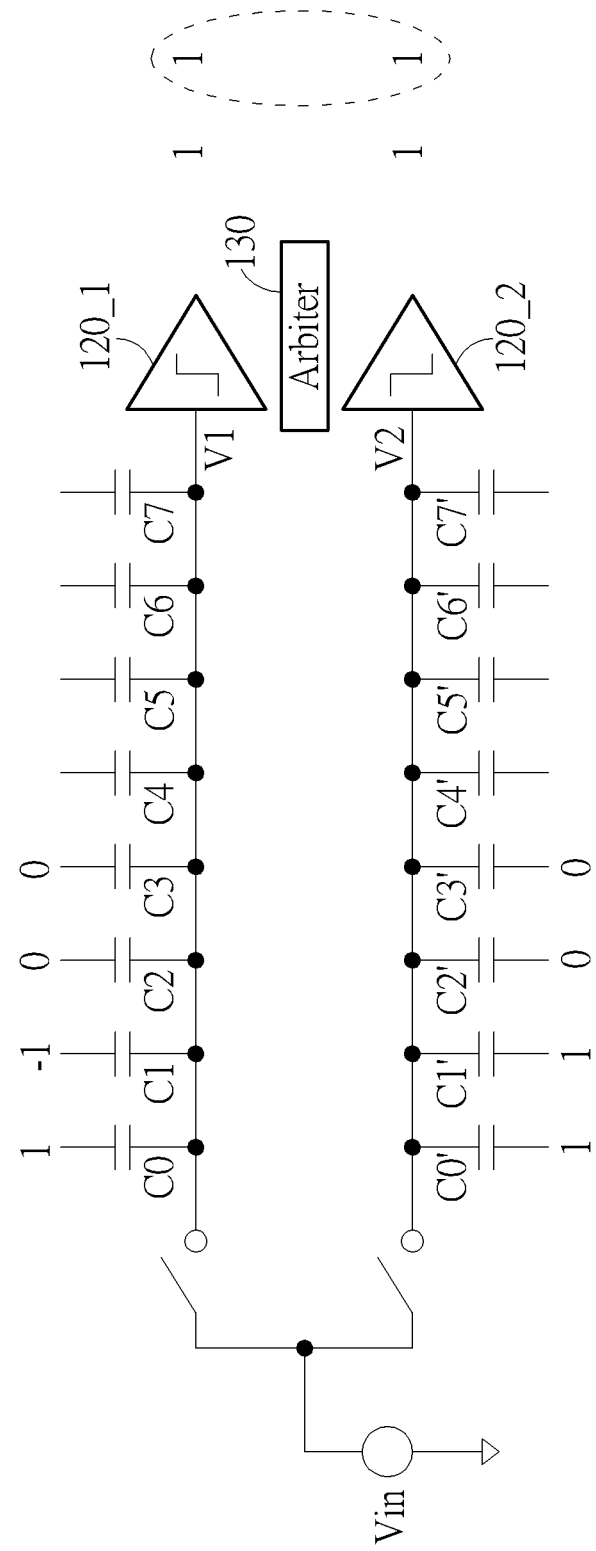

FIG. 7 shows a comparison step of a second cycle according to one embodiment of the present invention. As shown in FIG. 7, the control circuit 140 controls the capacitor array 110_1 and 110_2 to make the capacitors C2, C3, C2' and C3' connect to the common voltage Vcm, and the comparator 120_1 compares the first signal V1 with the first reference signal to generate the first comparison result, and the comparator 120_2 compares the second signal V2 with the second reference signal to generate the second comparison result. In this embodiment, it is assumed that the first signal V1 is greater than the first reference signal, and the second signal V2 is greater than the second reference signal, so both the first comparison result and the second comparison result are equal to "1".

Figure 8:
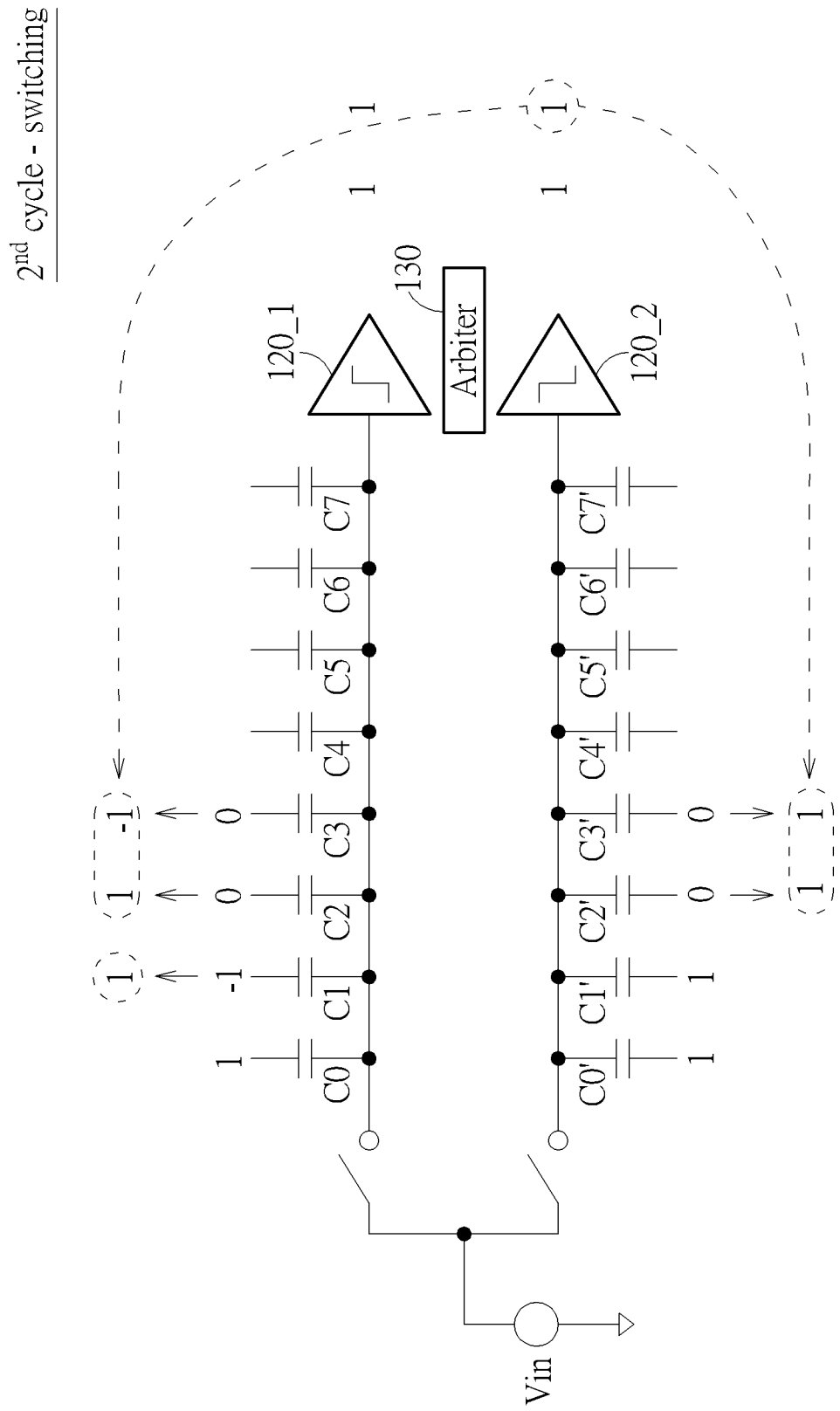

FIG. 8 shows a switching step of the second cycle according to one embodiment of the present invention. As shown in FIG. 8, the control circuit 140 refers to the first comparison result and the second comparison result to switch the connections of the capacitors C2, C3, C2' and C3', and further to switch the connection of one of the capacitor C1 and C1' to correct the bit value. Specifically, because the second comparison result is equal to "1", the bits B2 and B2' are changed from "0" to "1", that is the capacitors C2 and C2' are connected to the positive voltage V+. The bits B3 and B3' are determined by guessing to have "−1 and "1", respectively. In addition, the bit B1 is corrected by using the bit B1' to have the value "1".

In addition, because the first comparison result is the same as the second comparison result in the second cycle, the arbitration result may not be considered. In other word, no matter the generation time of the first comparison result is earlier or later than the generation time of the second comparison result, the switching step will be the same.

Figure 9:
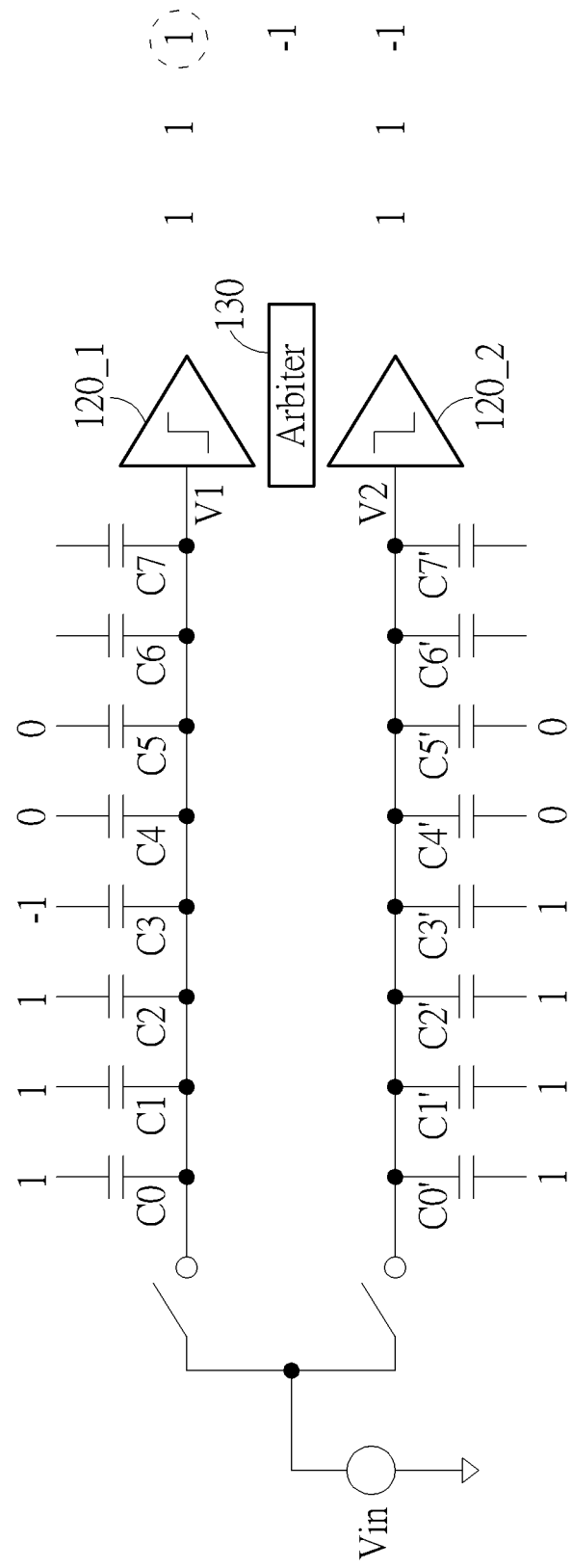

FIG. 9 shows a comparison step of a third cycle according to one embodiment of the present invention. As shown in FIG. 9, the control circuit 140 controls the capacitor array 110_1 and 110_2 to make the capacitors C4, C5, C4' and C5' connect to the common voltage Vcm, and the comparator 120_1 compares the first signal V1 with the first reference signal to generate the first comparison result, and the comparator 120_2 compares the second signal V2 with the second reference signal to generate the second comparison result. In this embodiment, it is assumed that the first signal V1 is greater than the first reference signal, and the second signal V2 is less than the second reference signal, so both the first comparison result and the second comparison result are equal to "1" and "−1", respectively. In addition, because the first comparison result and the second comparison result are inconsistent, the arbitration result needs to be considered. In this embodiment, it is assumed that the arbiter 130 generates the arbitration result "−1", which indicates that the generation time of the first comparison result is later than the generation time of the second comparison result.

Figure 10:
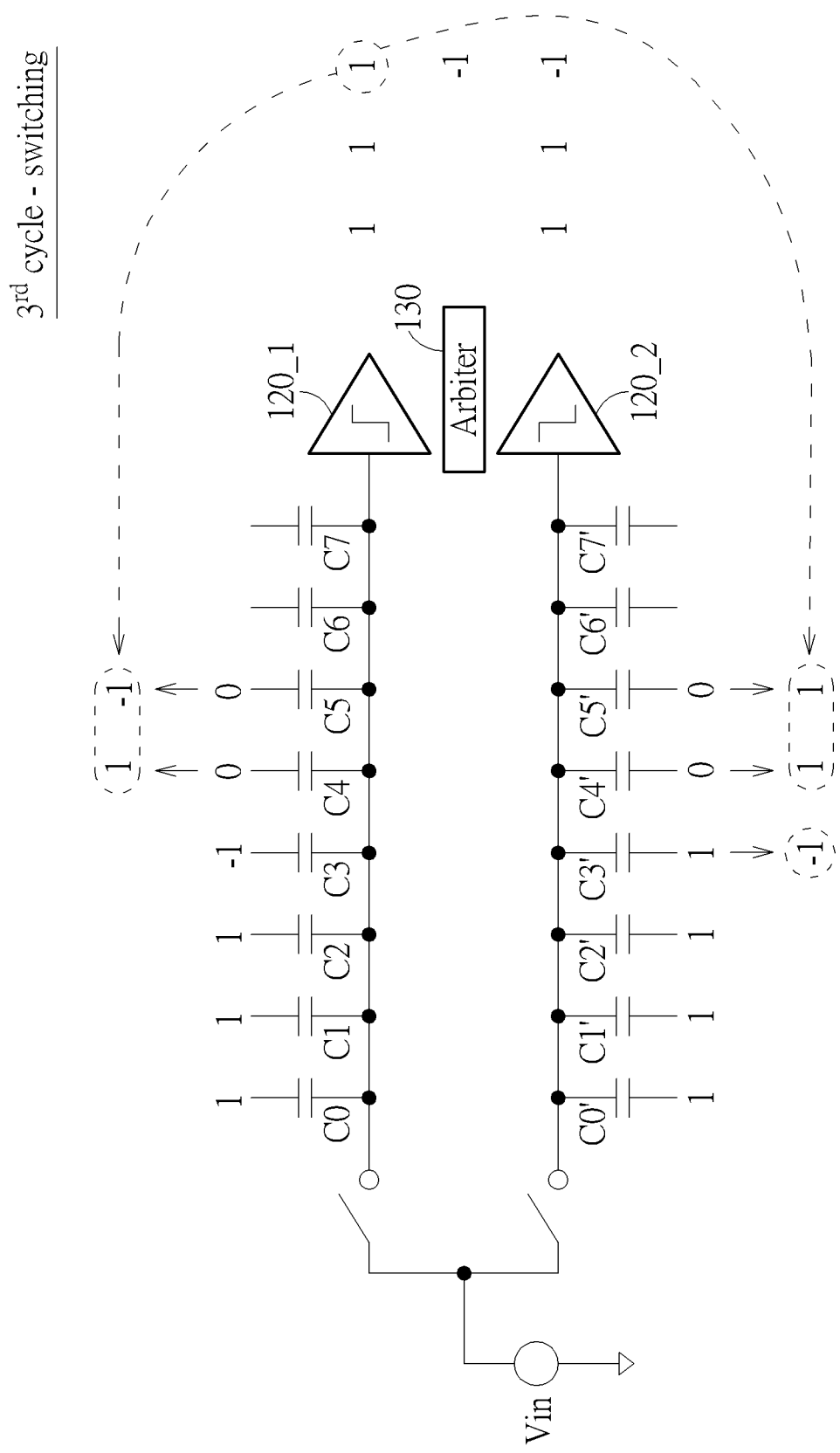

FIG. 10 shows a switching step of the third cycle according to one embodiment of the present invention. As shown in FIG. 10, because the arbiter 130 generates the arbitration result indicating that the generation time of the first comparison result is later than the generation time of the second comparison result, the control circuit 140 can determine that the first comparison result is correct or more reliable, and the control circuit 140 refers to the first comparison result to switch the connections of the capacitors C4, C5, C4' and C5', and further to switch the connection of one of the capacitor C3 and C3' to correct the bit value. Specifically, because the first comparison result is determined to be correct, the bits B4 and B4' are changed from "0" to "1", that is the capacitors C4 and C4' are connected to the positive voltage V+. The bits B5 and B5' are determined by guessing to have "−1 and "1", respectively. In addition, the bit B3' is corrected by using the bit B3 to have the value "−1".

Figure 11:
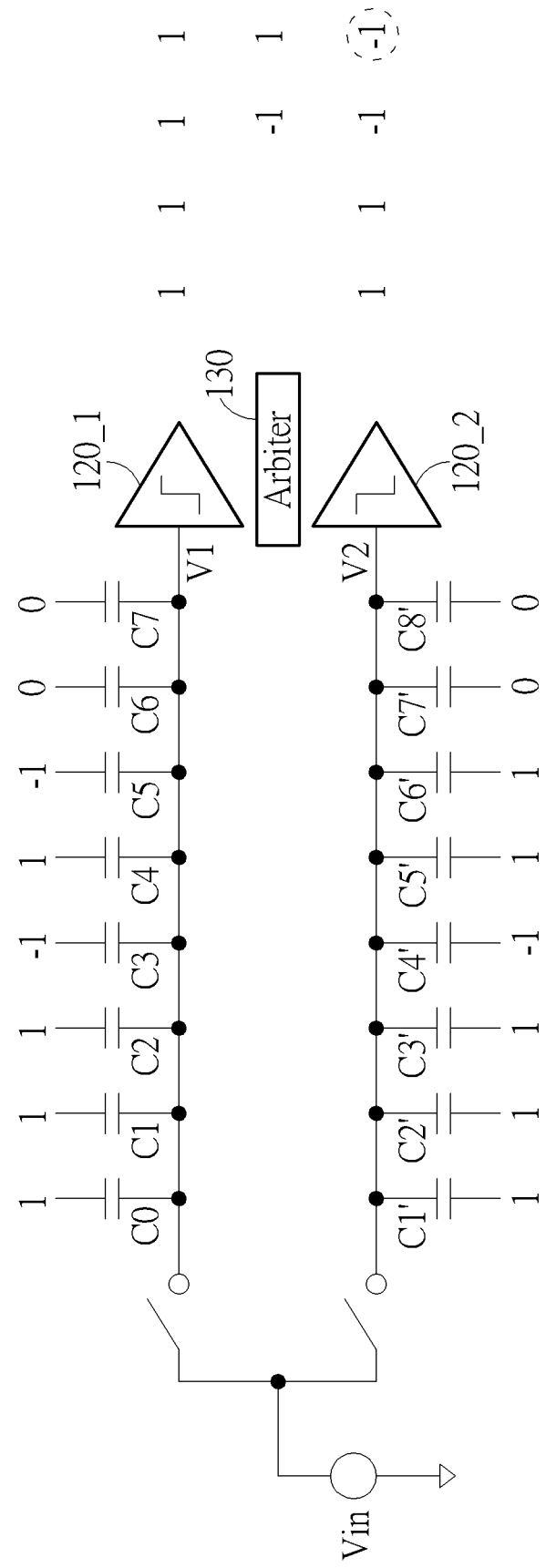

FIG. 11 shows a comparison step of a fourth cycle according to one embodiment of the present invention. As shown in FIG. 11, the control circuit 140 controls the capacitor array 110_1 and 110_2 to make the capacitors C7, C8, C7' and C8' connect to the common voltage Vcm, and the comparator 120_1 compares the first signal V1 with the first reference signal to generate the first comparison result, and the comparator 120_2 compares the second signal V2 with the second reference signal to generate the second comparison result. In this embodiment, it is assumed that the first signal V1 is greater than the first reference signal, and the second signal V2 is less than the second reference signal, so both the first comparison result and the second comparison result are equal to "1" and "−1", respectively. In addition, because the first comparison result and the second comparison result are inconsistent, the arbitration result needs to be considered. In this embodiment, it is assumed that the arbiter 130 generates the arbitration result "1", which indicates that the generation time of the first comparison result is earlier than the generation time of the second comparison result.

Figure 12:
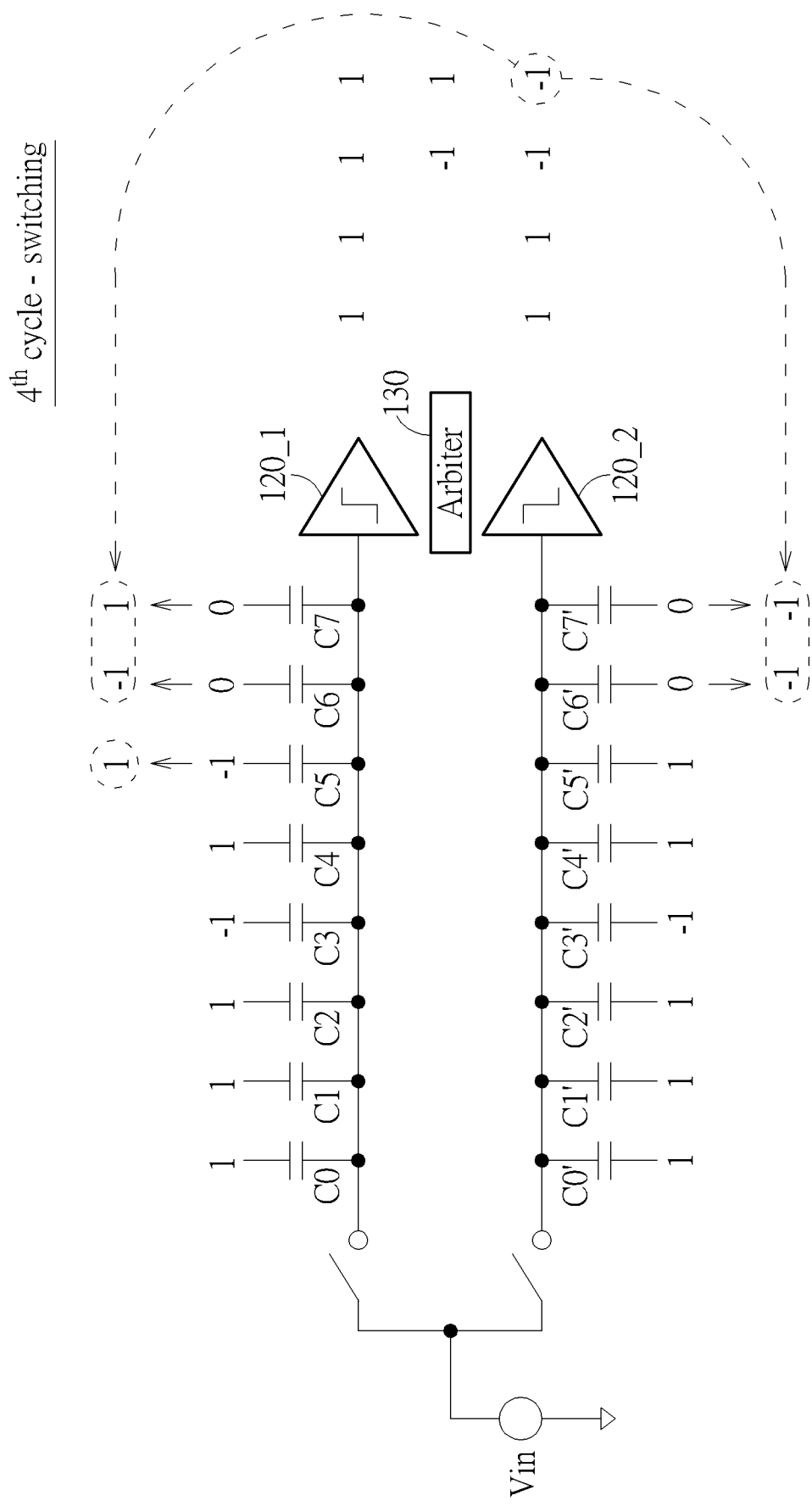

FIG. 12 shows a switching step of the fourth cycle according to one embodiment of the present invention. As shown in FIG. 12, because the arbiter 130 generates the arbitration result indicating that the generation time of the first comparison result is earlier than the generation time of the second comparison result, the control circuit 140 can determine that the second comparison result is correct or more reliable, and the control circuit 140 refers to the second comparison result to switch the connections of the capacitors C6, C7, C6' and C7', and further to switch the connection of one of the capacitor C5 and C5' to correct the bit value. Specifically, because the second comparison result is determined to be correct, the bits B6 and B6' are changed from "0" to "1", that is the capacitors C6 and C6' are connected to the positive voltage V+. The bits B7 and B7' are determined by guessing to have "1 and "−1", respectively. In addition, the bit B5 is corrected by using the bit B5' to have the value "1".

In addition, one additional comparison may be required to determine the guesses of the bits B7 and B7'.

By using the aforementioned embodiment, the output signal Dout can be successfully generated by using the SAR ADC 100 having only two capacitors 120_1 and 120_2 and two corresponding capacitor arrays 110_1 and 110_2. Therefore, compared with the conventional 2-bit-per-cycle SAR ADC having three capacitors and three capacitor arrays, the mismatch/offset between the capacitor arrays and the comparators of the SAR ADC 100 of the present invention can be mitigated. In addition, because the arbiter design is simpler than the comparator, the SAR ADC 100 may have lower manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A successive approximation register analog-to-digital converter (SAR ADC), comprising:
   a first capacitor array, for receiving an input signal to generate a first signal;
   a first comparator, coupled to the first capacitor array, for comparing the first signal with a first reference signal to generate a first comparison result;
   a second capacitor array, for receiving the input signal to generate a second signal;
   a second comparator, coupled to the second capacitor array, for comparing the second signal with a second reference signal to generate a second comparison result;
   an arbiter, coupled to the first comparator and the second comparator, for receiving the first comparison result and the second comparison result, and generating an arbitration result according to the first comparison result and the second comparison result; and
   a control circuit, coupled to the first comparator, the second comparator and the arbiter, for generating an output signal according to the first comparison result, the second comparison result and the arbitration result;
   wherein the arbiter is a time-based arbiter, and the arbiter generates the arbitration result by referring generation times of the first comparison result and the second comparison result;
   wherein when the generation time of the first comparison result is later than the generation time of the second comparison result, the arbiter generates that arbitration result indicating that the first comparison result is correct, and the control circuit uses the first comparison result to generate the output signal if the first comparison result and the second comparison result are inconsistent; and when the generation time of the first comparison result is earlier than the generation time of the second comparison result, the arbiter generates that arbitration result indicating that the second comparison result is correct, and the control circuit uses the second comparison result to generate the output signal if the first comparison result and the second comparison result are inconsistent.

2. A successive approximation register analog-to-digital converter (SAR ADC), comprising:
   a first capacitor array, for receiving an input signal to generate a first signal;

a first comparator, coupled to the first capacitor array, for comparing the first signal with a first reference signal to generate a first comparison result;
a second capacitor array, for receiving the input signal to generate a second signal;
a second comparator, coupled to the second capacitor array, for comparing the second signal with a second reference signal to generate a second comparison result;
an arbiter, coupled to the first comparator and the second comparator, for receiving the first comparison result and the second comparison result, and generating an arbitration result according to the first comparison result and the second comparison result; and
a control circuit, coupled to the first comparator, the second comparator and the arbiter, for generating an output signal according to the first comparison result, the second comparison result and the arbitration result;
wherein the arbiter is a time-based arbiter, and the arbiter generates the arbitration result by referring generation times of the first comparison result and the second comparison result;
wherein the first comparator further generates a first valid signal for indicating the generation time of the first comparison result, the second comparator further generates a second valid signal for indicating the generation time of the second comparison result, and the arbiter refers to the first valid signal and the second valid signal to generate the arbitration result.

3. A method for controlling a successive approximation register analog-to-digital converter (SAR ADC), wherein the SAR ADC comprises:
a first capacitor array, for receiving an input signal to generate a first signal;
a first comparator, coupled to the first capacitor array, for comparing the first signal with a first reference signal to generate a first comparison result;
a second capacitor array, for receiving the input signal to generate a second signal;
a second comparator, coupled to the second capacitor array, for comparing the second signal with a second reference signal to generate a second comparison result; and
the method comprises:
referring to generation times of the first comparison result and the second comparison result to generate an arbitration result;
when the generation time of the first comparison result is later than the generation time of the second comparison result, generating the arbitration result indicating that the first comparison result is correct, and using the first comparison result to generate the output signal if the first comparison result and the second comparison result are inconsistent; and
when the generation time of the first comparison result is earlier than the generation time of the second comparison result, generating the arbitration result indicating that the second comparison result is correct, and using the second comparison result to generate the output signal if the first comparison result and the second comparison result are inconsistent;
generating an output signal according to the first comparison result, the second comparison result and the arbitration result.

4. The method of claim 3, wherein the SAR ADC is a 2-bit-per-cycle SAR ADC.

* * * * *